United States Patent
Cao

(10) Patent No.: US 9,564,097 B2
(45) Date of Patent: Feb. 7, 2017

(54) SHIFT REGISTER, STAGE-SHIFT GATE DRIVING CIRCUIT AND DISPLAY PANEL

(71) Applicant: Shenzhen China Star Optoelectronics Technology Co., Ltd., Shenzhen, Guangdong (CN)

(72) Inventor: Shangcao Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 144 days.

(21) Appl. No.: 14/426,354

(22) PCT Filed: Dec. 29, 2014

(86) PCT No.: PCT/CN2014/095388
§ 371 (c)(1),
(2) Date: Mar. 5, 2015

(87) PCT Pub. No.: WO2016/095267
PCT Pub. Date: Jun. 23, 2016

(65) Prior Publication Data
US 2016/0343332 A1    Nov. 24, 2016

(30) Foreign Application Priority Data

Dec. 15, 2014 (CN) .......................... 2014 1 0778946

(51) Int. Cl.
*G09G 3/36* (2006.01)
*G11C 19/28* (2006.01)

(52) U.S. Cl.
CPC .............. *G09G 3/3677* (2013.01); *G09G 3/36* (2013.01); *G09G 3/3696* (2013.01); *G11C 19/28* (2013.01);
(Continued)

(58) Field of Classification Search
CPC ...... G09G 3/3677; G09G 3/3696; G09G 3/36; G09G 3/3674; G09G 3/3681; G09G 3/3266; G09G 2300/0809; G09G 2310/0286; G09G 2310/0289; G09G 2310/0243; G09G 2310/0202; G11C 19/28
(Continued)

(56) References Cited

U.S. PATENT DOCUMENTS 7,233,308 B2    6/2007  Park et al.
7,319,452 B2    1/2008  Moon et al.
(Continued)

FOREIGN PATENT DOCUMENTS

CN      101609719 A    12/2009
CN      102509537 A     6/2012
(Continued)

*Primary Examiner* — Tom Sheng
(74) *Attorney, Agent, or Firm* — Andrew C. Cheng

(57) ABSTRACT

A shift register, a stage-shift gate driving circuit and a display panel are provided. The shift register includes a down-delivering module, an output module, a first pull-down maintaining module, a second pull-down maintaining module, a first pull-down module and a second pull-down module. The down-delivering module is for receiving a stage-shift signal(s) from a preceding-stage shift register. The output module is for outputting stage-shift signals and a scan signal. The first pull-down maintaining module, the second pull-down maintaining module, the first pull-down module and the second pull-down module are for keeping the output signal of the output module to be a low voltage level after the output module outputs the scan signal. By the above solution, the invention can reduce the size of transistor, prevent the deterioration of transistor and increase the circuit output capability.

17 Claims, 6 Drawing Sheets

(52) U.S. Cl.
CPC ............ *G09G 2300/0809* (2013.01); *G09G 2310/0286* (2013.01); *G09G 2310/0289* (2013.01)

(58) Field of Classification Search
USPC .................................................. 345/100, 213
See application file for complete search history.

(56) References Cited

U.S. PATENT DOCUMENTS

| | | | |
|---|---|---|---|
| 8,368,634 B2* | 2/2013 | Moon .................... | G11C 19/28 345/100 |
| 2007/0164973 A1* | 7/2007 | Tobita .................. | G09G 3/3648 345/100 |
| 2008/0055293 A1* | 3/2008 | Kuo ..................... | G09G 3/3648 345/204 |
| 2008/0187089 A1* | 8/2008 | Miyayama ............ | G11C 19/28 377/79 |
| 2011/0216877 A1* | 9/2011 | Hsu ...................... | G11C 19/00 377/79 |
| 2012/0105398 A1* | 5/2012 | Park ..................... | H03K 19/018521 345/206 |
| 2012/0162187 A1* | 6/2012 | Lee ....................... | G09G 3/007 345/212 |
| 2013/0181747 A1* | 7/2013 | Yoon .................... | G11C 19/184 327/108 |
| 2015/0077407 A1* | 3/2015 | Kim ..................... | G09G 3/3611 345/204 |
| 2015/0339997 A1* | 11/2015 | Yang .................... | G09G 3/3677 345/212 |
| 2016/0019828 A1* | 1/2016 | Lin ....................... | G09G 3/20 345/214 |
| 2016/0148589 A1* | 5/2016 | Cao ...................... | G09G 3/3677 345/208 |
| 2016/0247455 A1* | 8/2016 | Cao ...................... | G09G 3/36 |

FOREIGN PATENT DOCUMENTS

| | | |
|---|---|---|
| CN | 102903323 A | 1/2013 |
| CN | 103077689 A | 5/2013 |
| CN | 103218962 A | 7/2013 |
| CN | 103474017 A | 12/2013 |
| CN | 103489484 A | 1/2014 |
| CN | 104008741 A | 8/2014 |
| EP | 2743930 A1 | 6/2014 |
| TW | 200841311 A | 10/2008 |

* cited by examiner

SHIFT REGISTER, STAGE-SHIFT GATE DRIVING CIRCUIT AND DISPLAY PANEL

TECHNICAL FIELD

The invention relates to the field of liquid crystal display technology, and particularly to a shift register, a stage-shift gate driving circuit and a display panel.

DESCRIPTION OF RELATED ART

A horizontal scanning drive of a current liquid crystal display panel mainly is accomplished by an externally connected integrated circuit, and the externally connected integrated circuit realizes the scanning by controlling all stages of horizontal scan lines to be charged and discharged stage by stage.

A gate driver on array (GOA) technology uses the original liquid crystal display panel manufacturing process to form a horizontal scanning driving circuit on a substrate at the periphery of the display region, so as to replace the drive of horizontal scan lines accomplished by the traditional externally connected integrated circuit, so that the border of the liquid crystal display panel can be narrowed.

However, in the conventional GOA circuit, an output time of a scan signal output terminal is excessively long, the volume of TFT at the scan signal output terminal is increased, a pull-down module only discharges the scan signal output terminal, so that some TFTs are deteriorated and the output capability of the scan signal output terminal is degraded.

SUMMARY

Accordingly, a technical problem mainly to be solved by the invention is to provide a shift register, a stage-shift gate driving circuit and a display panel, which can reduce the size of transistor, prevent the deterioration of transistor and increase the circuit output capability.

In order to solve the above technical problem, a technical solution provided by the invention is to provide a shift register. The shift register includes a down-delivering module, an output module, a first pull-down maintaining module, a second pull-down maintaining module, a first pull-down module and a second pull-down module. The down-delivering module, the output module, the first pull-down maintaining module and the second pull-down maintaining module are electrically connected to a first common node, the first pull-down module is electrically connected to the first pull-down maintaining module and the second pull-down maintaining module, the second pull-down module is electrically connected between the first pull-down module and the output module. A potential of the first common node becomes a high voltage level when the down-delivering module receives a high voltage level stage-shift signal(s) from a preceding-stage shift register, the first pull-down maintaining module and the second pull-down maintaining module are configured (i.e., structured and arranged) for alternately receiving a high voltage level signal inputted from a succeeding-stage shift register and thereby making the first pull-down module to be electrically conducted with the first common node so as to pull down and maintain the first common node to be a low voltage level, and meanwhile the second pull-down module is configured for pulling down and maintaining a scan signal outputted from the output module to be a low voltage level according to the state of the first pull-down module being electrically conducted with the first common node.

In an embodiment, the down-delivering module includes a first stage-shift signal input terminal and a second stage-shift signal input terminal respectively electrically connected to a first stage-shift signal output terminal and a second stage-shift signal output terminal of the preceding-stage shift register. The output module includes a first signal input terminal, a second signal input terminal, a first stage-shift signal output terminal, a second stage-shift signal output terminal and a scan signal output terminal. The first stage-shift signal output terminal and the second stage-shift signal output terminal of the output module are configured for being respectively electrically connected to a first stage-shift signal input terminal and a second stage-shift signal input terminal of the preceding-stage and/or the succeeding-stage shift register and for supplying stage-shift signals, the first signal input terminal and the second signal input terminal are configured for receiving alternating current signals. The first pull-down maintaining module includes a third stage-shift signal input terminal and a third signal input terminal, the third stage-shift signal input terminal is configured for being electrically connected to a first stage-shift signal output terminal of the succeeding-stage shift register, and the third signal input terminal is configured for receiving an alternating current signal. The second pull-down maintaining module includes a fourth stage-shift signal input terminal and a fourth signal input terminal, the fourth stage-shift signal input terminal is configured for being electrically connected to the first stage-shift signal output terminal of the succeeding-stage shift register, and the fourth signal input terminal is configured for receiving an alternating current signal. The first pull-down module includes a fifth signal input terminal configured for receiving a low voltage level signal. The second pull-down module includes a fifth stage-shift signal input terminal configured for being electrically connected to the first stage-shift signal output terminal of the succeeding-stage shift register. When the down-delivering module receives the high voltage level stage-shift signals from the preceding-stage shift register by the first stage-shift signal input terminal and the second stage-shift signal input terminal, the potential at the first common node becomes the high voltage level, the first signal input terminal and the second signal input terminal of the output module receive low voltage level clock signals, and the output module outputs a low voltage level scan signal by the scan signal output terminal. After the down-delivering module is turned off, the first common node still is at the high voltage level, the first signal input terminal and the second signal input terminal of the output module receive high voltage level clock signals, and the output module outputs a high voltage level scan signal by the scan signal output terminal. After the scan signal output terminal outputs the high voltage level scan signal, the third stage-shift signal input terminal, the fourth stage-shift signal input terminal and the sixth signal input terminal are inputted with a high voltage level stage-shift signal from the first stage-shift signal output terminal of the succeeding-stage shift register, the third signal input terminal and the fourth signal input terminal are alternately inputted with high voltage level signals to make the first pull-down module be electrically conducted with the first common node and thereby alternately to pull down the first common node and the scan signal output terminal to a low voltage level, and meanwhile the second pull-down module pulls down the first common node and the scan signal output terminal to the low voltage level.

In an embodiment, the down-delivering module includes a first transistor; a drain of the first transistor is electrically connected to the second stage-shift signal input terminal, a source of the first transistor is electrically connected to the first common node, and a gate of the first transistor is electrically connected to the first stage-shift signal input terminal.

In an alternative embodiment, the drain of the first transistor is electrically connected to a direct current source.

In an embodiment, the output module includes a second transistor, a third transistor and a fourth transistor. A drain of the second transistor is electrically connected to the first signal input terminal, and a source of the second transistor is electrically connected to the scan signal output terminal. A drain of the third transistor is electrically connected to the second signal input terminal, and a source of the third transistor is electrically connected to the first stage-shift signal output terminal. A drain of the fourth transistor is electrically connected to the second signal input terminal, and a source of the fourth transistor is electrically connected to the second stage-shift signal output terminal. Gates of the second transistor, the third transistor and the fourth transistor all are electrically connected to the first common node. A gate of the third transistor and the source of the third transistor have a capacitor electrically connected therebetween.

In an embodiment, the first pull-down module includes a fifth transistor, a sixth transistor, a seventh transistor, an eighth transistor and a ninth transistor; the first pull-down maintaining module includes a tenth transistor, an eleventh transistor, a twelfth transistor, a thirteenth transistor and a fourteenth transistor; the second pull-down maintaining module includes a fifteenth transistor, a sixteenth transistor, a seventeenth transistor, an eighteenth transistor and a nineteenth transistor. Gates of the fifth transistor, the sixth transistor and the seventh transistor all are electrically connected to the first common node, sources of the sixth transistor and the seventh transistor are electrically connected to the fifth signal input terminal. Gates of the eighth transistor and the ninth transistor are electrically connected to the first stage-shift signal input terminal, sources of the eighth transistor and the ninth transistor are electrically connected to the fifth signal input terminal. Drains of the tenth transistor, the eleventh transistor and the twelfth transistor and a gate of the twelfth transistor all are electrically connected to the third signal input terminal, a gate of the tenth transistor is electrically connected to the third stage-shift signal input terminal, and a source of the tenth transistor is electrically connected to a source of the eleventh transistor at a second common node. A gate of the eleventh transistor is electrically connected to a source of the twelfth transistor. The source of the twelfth transistor is electrically connected to a drain of the eighth transistor. A drain of the thirteenth transistor is electrically connected to the first common node, a gate of the thirteenth transistor is electrically connected to the second common node, and a source of the thirteenth transistor is electrically connected to the fifth signal input terminal. A drain of the fourteenth transistor is electrically connected to the scan signal output terminal, a gate of the fourteenth transistor is electrically connected to the second common node, and a source of the fourteenth transistor is electrically connected to the fifth signal input terminal. Drains of the fifteenth transistor, the sixteenth transistor and the seventeenth transistor and a gate of the seventeenth transistor all are electrically connected to the fourth signal input terminal, a gate of the fifteenth transistor is electrically connected to the fourth stage-shift signal input terminal, and a source of the fifteenth transistor is electrically connected to a source of the sixteenth transistor at a third common node. A gate of the sixteenth transistor is electrically connected to a source of the seventeenth transistor. The source of the seventeenth transistor is electrically connected to a drain of the ninth transistor. A drain of the eighteenth transistor is electrically connected to the first common node, a gate of the eighteenth transistor is electrically connected to the third common node, and a source of the eighteenth transistor is electrically connected to the fifth signal input terminal. A drain of the nineteenth transistor is electrically connected to the scan signal output terminal, a gate of the nineteenth transistor is electrically connected to the third common node, and a source of the nineteenth transistor is electrically connected to the fifth signal input terminal.

In an alternative embodiment, the gate of the tenth transistor is electrically connected with the fourth signal input terminal, and the gate of the fifteenth transistor is electrically connected with the third signal input terminal.

In an embodiment, the second pull-down module includes a twentieth transistor, a twenty-first transistor and a twenty-second transistor. Gates of the twentieth transistor, the twenty-first transistor and the twenty-second transistor all are electrically connected to the fifth stage-shift signal input terminal, sources of the twentieth transistor, the twenty-first transistor and the twenty-second transistor all are electrically connected to the fifth signal input terminal. A drain of the twentieth transistor is electrically connected to the scan signal output terminal, a drain of the twenty-first transistor is electrically connected to the first stage-shift signal output terminal, and a drain of the twenty-second transistor is electrically connected to the first common node.

In order to solve the above technical problem, another technical solution provided by the invention is to provide a stage-shift gate driving circuit. The stage-shift gate driving circuit includes a plurality of above-described shift registers. The first stage-shift signal output terminal and the second stage-shift signal output terminal of each shift register are electrically connected to corresponding stage-shift signal input terminals of a preceding-stage shift register and a succeeding-stage shift register and for supplying stage-shift signals.

In an embodiment, the first stage-shift signal input terminal and the second stage-shift signal input terminal of the first-stage shift register in the stage-shift gate driving circuit are electrically connected to receive a STV signal (i.e., generally referred to as start pulse signal); the third stage-shift signal input terminal, the fourth stage-shift signal input terminal and the fifth stage-shift signal input terminal of the final-stage shift register in the stage-shift gate driving circuit are electrically connected to receive the STV signal.

In an embodiment, the down-delivering module includes a first stage-shift signal input terminal and a second stage-shift signal input terminal respectively electrically connected to a first stage-shift signal output terminal and a second stage-shift signal output terminal of the preceding-stage shift register. The output module includes a first signal input terminal, a second signal input terminal, a first stage-shift signal output terminal, a second stage-shift signal output terminal and a scan signal output terminal. The first stage-shift signal output terminal and the second stage-shift signal output terminal of the output module are configured for being respectively electrically connected to a first stage-shift signal input terminal and a second stage-shift signal input terminal of the preceding-stage and/or the succeeding-stage shift register and for supplying stage-shift signals, the first signal input terminal and the second signal input terminal are configured for receiving alternating current signals. The first pull-down maintaining module includes a third stage-shift signal input terminal and a third signal input terminal, the third stage-shift signal input terminal is configured for being electrically connected to a first stage-shift signal output terminal of the succeeding-stage shift register, and the third signal input terminal is configured for receiving an alternating current signal. The second pull-down maintaining module includes a fourth stage-shift signal input terminal and a fourth signal input terminal, the fourth stage-shift signal input terminal is configured for being electrically connected to the first stage-shift signal output terminal of the succeeding-stage shift register, and the fourth signal input terminal is configured for receiving an alternating current signal. The first pull-down module includes a fifth signal input terminal configured for receiving a low voltage level signal. The second pull-down module includes a fifth stage-shift signal input terminal configured for being electrically connected to the first stage-shift signal output terminal of the succeeding-stage shift register. When the down-delivering module receives the high voltage level stage-shift signals from the preceding-stage shift register by the first stage-shift signal input terminal and the second stage-shift signal input terminal, the potential at the first common node becomes the high voltage level, the first signal input terminal and the second signal input terminal of the output module receive low voltage level clock signals, and the output module outputs a low voltage level scan signal by the scan signal output terminal. After the down-delivering module is turned off, the first common node still is at the high voltage level, the first signal input terminal and the second signal input terminal of the output module receive high voltage level clock signals, and the output module outputs a high voltage level scan signal by the scan signal output terminal. After the scan signal output terminal outputs the high voltage level scan signal, the third stage-shift signal input terminal, the fourth stage-shift signal input terminal and the sixth signal input terminal are inputted with a high voltage level stage-shift signal from the first stage-shift signal output terminal of the succeeding-stage shift register, the third signal input terminal and the fourth signal input terminal are alternately inputted with high voltage level signals to make the first pull-down module be electrically conducted with the first common node and thereby alternately to pull down the first common node and the scan signal output terminal to a low voltage level, and meanwhile the second pull-down module pulls down the first common node and the scan signal output terminal to the low voltage level.

In an embodiment, the down-delivering module includes a first transistor; a drain of the first transistor is electrically connected to the second stage-shift signal input terminal, a source of the first transistor is electrically connected to the first common node, and a gate of the first transistor is electrically connected to the first stage-shift signal input terminal.

In an alternative embodiment, the drain of the first transistor is electrically connected to a direct current source.

In an embodiment, the output module includes a second transistor, a third transistor and a fourth transistor. A drain of the second transistor is electrically connected to the first signal input terminal, and a source of the second transistor is electrically connected to the scan signal output terminal. A drain of the third transistor is electrically connected to the second signal input terminal, and a source of the third transistor is electrically connected to the first stage-shift signal output terminal. A drain of the fourth transistor is electrically connected to the second signal input terminal, and a source of the fourth transistor is electrically connected to the second stage-shift signal output terminal. Gates of the second transistor, the third transistor and the fourth transistor all are electrically connected to the first common node. A gate of the third transistor and the source of the third transistor have a capacitor electrically connected therebetween.

In an embodiment, the first pull-down module includes a fifth transistor, a sixth transistor, a seventh transistor, an eighth transistor and a ninth transistor; the first pull-down maintaining module includes a tenth transistor, an eleventh transistor, a twelfth transistor, a thirteenth transistor and a fourteenth transistor; the second pull-down maintaining module includes a fifteenth transistor, a sixteenth transistor, a seventeenth transistor, an eighteenth transistor and a nineteenth transistor. Gates of the fifth transistor, the sixth transistor and the seventh transistor all are electrically connected to the first common node, sources of the sixth transistor and the seventh transistor are electrically connected to the fifth signal input terminal. Gates of the eighth transistor and the ninth transistor are electrically connected to the first stage-shift signal input terminal, sources of the eighth transistor and the ninth transistor are electrically connected to the fifth signal input terminal. Drains of the tenth transistor, the eleventh transistor and the twelfth transistor and a gate of the twelfth transistor all are electrically connected to the third signal input terminal, a gate of the tenth transistor is electrically connected to the third stage-shift signal input terminal, and a source of the tenth transistor is electrically connected to a source of the eleventh transistor at a second common node. A gate of the eleventh transistor is electrically connected to a source of the twelfth transistor. The source of the twelfth transistor is electrically connected to a drain of the eighth transistor. A drain of the thirteenth transistor is electrically connected to the first common node, a gate of the thirteenth transistor is electrically connected to the second common node, and a source of the thirteenth transistor is electrically connected to the fifth signal input terminal. A drain of the fourteenth transistor is electrically connected to the scan signal output terminal, a gate of the fourteenth transistor is electrically connected to the second common node, and a source of the fourteenth transistor is electrically connected to the fifth signal input terminal. Drains of the fifteenth transistor, the sixteenth transistor and the seventeenth transistor and a gate of the seventeenth transistor all are electrically connected to the fourth signal input terminal, a gate of the fifteenth transistor is electrically connected to the fourth stage-shift signal input terminal, and a source of the fifteenth transistor is electrically connected to a source of the sixteenth transistor at a third common node. A gate of the sixteenth transistor is electrically connected to a source of the seventeenth transistor. The source of the seventeenth transistor is electrically connected to a drain of the ninth transistor. A drain of the eighteenth transistor is electrically connected to the first common node, a gate of the eighteenth transistor is electrically connected to the third common node, and a source of the eighteenth transistor is electrically connected to the fifth signal input terminal. A drain of the nineteenth transistor is electrically connected to the scan signal output terminal, a gate of the nineteenth transistor is electrically connected to the third common node, and a source of the nineteenth transistor is electrically connected to the fifth signal input terminal.

In an alternative embodiment, the gate of the tenth transistor is electrically connected with the fourth signal input terminal, and the gate of the fifteenth transistor is electrically connected with the third signal input terminal.

In an embodiment, the second pull-down module includes a twentieth transistor, a twenty-first transistor and a twenty-second transistor. Gates of the twentieth transistor, the twenty-first transistor and the twenty-second transistor all are electrically connected to the fifth stage-shift signal input terminal, sources of the twentieth transistor, the twenty-first transistor and the twenty-second transistor all are electrically connected to the fifth signal input terminal. A drain of the twentieth transistor is electrically connected to the scan signal output terminal, a drain of the twenty-first transistor is electrically connected to the first stage-shift signal output terminal, and a drain of the twenty-second transistor is electrically connected to the first common node.

In order to solve the above technical problem, still another technical solution provided by the invention is to provide a display panel. The display panel includes the stage-shift gate driving circuit as above described.

In an embodiment, the first stage-shift signal input terminal and the second stage-shift signal input terminal of the first-stage shift register of the stage-shift gate driving signal are electrically connected to receive a STV signal. The third stage-shift signal input terminal, the fourth stage-shift signal input terminal and the fifth stage-shift signal input terminal of the final-stage shift register of the stage-shift gate driving circuit are electrically connected to receive the STV signal.

The efficacy can be achieved by the invention is that: different from the prior art, the invention uses the stage-shift signal(s) from the preceding-stage shift register to control the output of scan signal of the current-stage shift register, and after the scan signal is outputted, uses two pull-down maintaining modules alternately to pull down the potential at the scan signal output terminal to a low voltage level in collaboration with the use of the second pull-down module to pull down the potential at the scan signal output terminal to the low voltage level, which can prevent the leakage of electricity of some transistor(s) in the circuit, ensure the scan signal output terminal to stably output a low voltage level signal, prevent the deterioration of transistor and reduce the volume.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
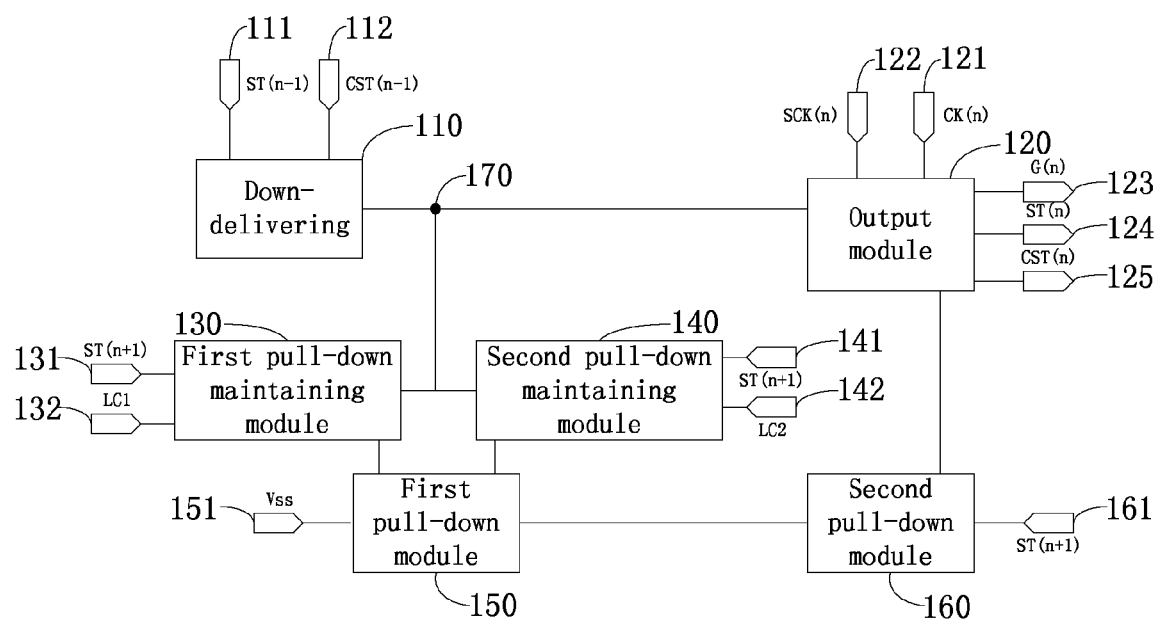
FIG. 1 is a schematic structural view of a first embodiment of a shift register of the invention.

Referring to FIG. 1, a schematic structural view of a first embodiment of a shift register of the invention is shown. The shift register includes: a down-delivering module 110, an output module 120, a first pull-down maintaining module 130, a second pull-down maintaining module 140, a first pull-down module 150 and a second pull-down module 160.

The down-delivering module 110 includes a first stage-shift signal input terminal 111 and a second stage-shift signal input terminal 112 respectively electrically connected to a first stage-shift signal output terminal and a second stage-shift signal output terminal of a preceding-stage shift register.

The output module 120 includes a first signal input terminal 121, a second signal input terminal 122, a first stage-shift signal output terminal 124, a second stage-shift signal output terminal 125 and a scan signal output terminal 123. The first stage-shift signal output terminal 124 and the second stage-shift signal output terminal 125 respectively are electrically connected to a first stage-shift signal input terminal and a second stage-shift signal input terminal of the preceding-stage and/or a succeeding-stage shift register and for supplying stage-shift signals. The first signal input terminal 121 and the second signal input terminal 122 are electrically connected to receive alternating current signals.

The first pull-down maintaining module 130 includes a third stage-shift signal input terminal 131 and a third signal input terminal 132 respectively electrically connected to the first stage-shift signal output terminal of the succeeding-stage shift register and an alternating current (AC) signal.

The second pull-down maintaining module 140 includes a fourth stage-shift signal input terminal 141 and a fourth signal input terminal 142 respectively electrically connected to the first stage-shift signal output terminal of the succeeding-stage shift register and an alternating current signal.

The first pull-down module 150 includes a fifth signal input terminal 151 electrically connected to receive a low voltage level signal.

The second pull-down module 160 includes a fifth stage-shift signal input terminal 161 electrically connected to the first stage-shift signal output terminal of the succeeding-stage shift register.

The down-delivering module 110, the output module 120, the first pull-down maintaining module 130 and the second pull-down maintaining module 140 are electrically connected to a first common node 170. The first pull-down module 150 is electrically connected to the first pull-down maintaining module 130 and the second pull-down maintaining module 140. The second pull-down module 160 is electrically connected between the first pull-down module 150 and the output module 120.

When the down-delivering module 110 receives high voltage level stage-shift signals from the preceding-stage shift register by the first stage-shift signal input terminal 111 and the second stage-shift signal input terminal 112, a potential at the first common node 170 becomes a high voltage level, the first signal input terminal 121 and the second signal input terminal 122 of the output module 120 receive low voltage level clock signals, and the output module 120 outputs a low voltage level scan signal by the scan signal output terminal 123. After the down-delivering module 110 is turned off, the first common node 170 still is at the high voltage level, the first signal input terminal 121 and the second signal input terminal 122 of the output module 120 receive high voltage level clock signals, and the output module 120 outputs a high voltage level scan signal by the scan signal output terminal 123. After the high voltage level output of the scan signal output terminal 123, the third stage-shift signal input terminal 131, the fourth stage-shift signal input terminal 141 and the sixth signal input terminal 161 are inputted with a high voltage level stage-shift signal at the first stage-shift signal output terminal of the succeeding-stage shift register, the third signal input terminal 132 and the fourth signal input terminal 142 are alternately inputted with high voltage level signals to make the first pull-down module 150 be electrically conducted with the first common node 170 and thereby alternately to pull down the first common node 170 and the scan signal output terminal 123 to a low voltage level, and meanwhile the second pull-down module 160 also pulls down the first common node 170 and the scan signal output terminal 123 to the low voltage level.

Different from the prior art, this embodiment uses stage-shift signals from the preceding-stage shift register to control the output of scan signal of the current-stage shift register, uses two pull-down maintaining modules to alternately pull down the potential at the scan signal output terminal to the low voltage level and cooperatively uses the second pull-down module to pull down the potential at the scan signal output terminal to the low voltage level after the output of the scan signal, which can prevent the leakage of electricity of some transistor(s) in the circuit and ensure the scan signal output terminal to stably output the low voltage level signal, and thus can avoid the deterioration of transistor and reduce the volume.

Figure 2:
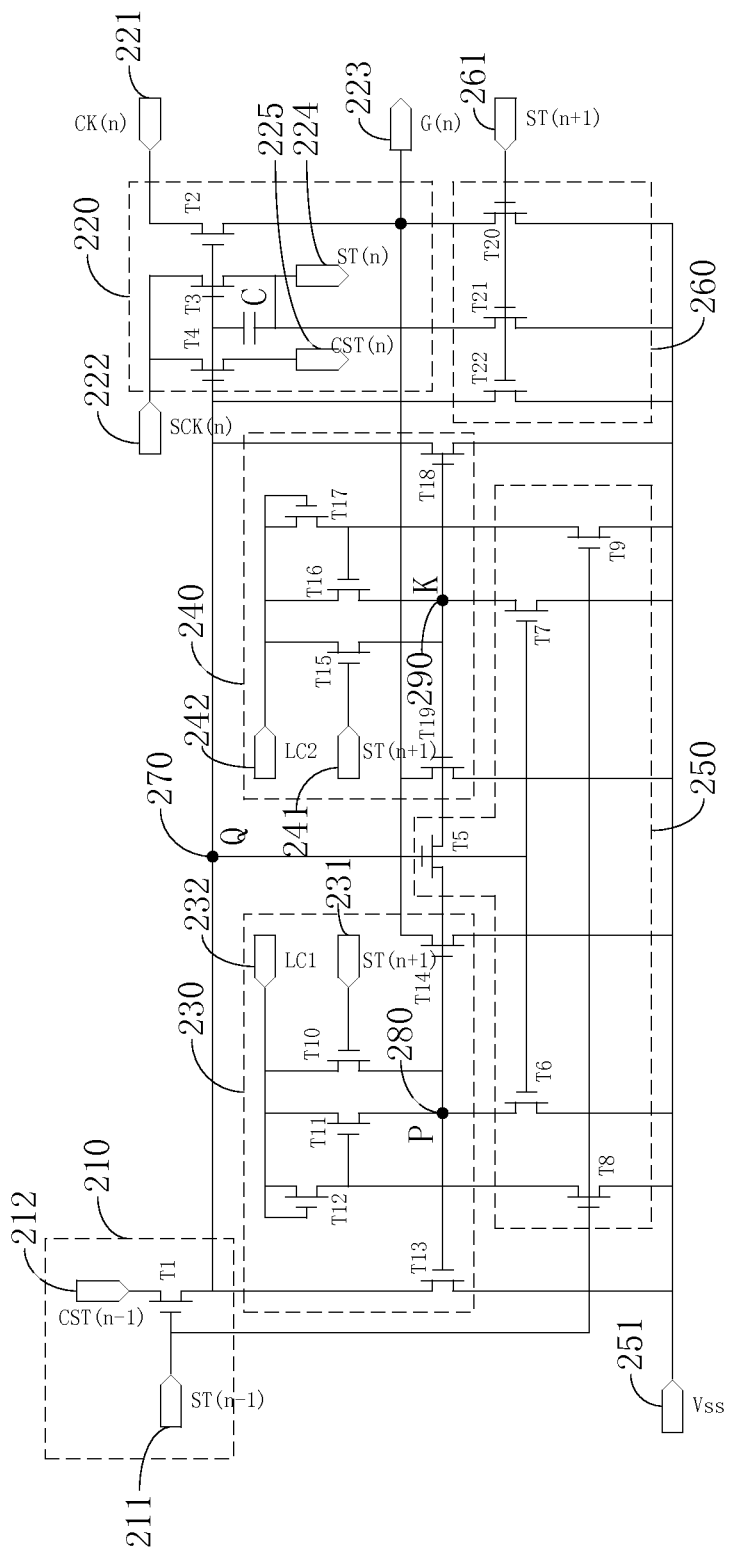
FIG. 2 is a circuit diagram of a second embodiment of the shift register of the invention.

Referring to FIG. 2, a circuit diagram of a second embodiment of the shift register of the invention is shown. The circuit includes a plurality of TFTs (thin film transistors) and a plurality of signal input/output terminals.

In particular, the down-delivering module 210 includes a first transistor T1. A drain of the first transistor T1 is electrically connected to a second stage-shift signal input terminal 212, a source of the first transistor T1 is electrically connected to a first common node Q 270, and a gate of the first transistor T1 is electrically connected to a first stage-shift signal input terminal 211.

The output module 220 includes a second transistor T2, a third transistor T3 and a fourth transistor T4. A drain of the second transistor T2 is electrically connected to a first signal input terminal 221, and a source of the second transistor T2 is electrically connected to a scan signal output terminal 223. A drain of the third transistor T3 is electrically connected to a second signal input terminal 222, and a source of the third transistor T3 is electrically connected to a first stage-shift signal output terminal 224. A drain of the fourth transistor T4 is electrically connected to the second signal input terminal 222, and a source of the fourth transistor T4 is electrically connected to a second stage-shift signal output terminal 225. Gates of the second transistor T2, the third transistor T3 and the fourth transistor T4 all are electrically connected to the first common node Q 270. The gate and the source of the third transistor T3 have a capacitor C electrically connected therebetween.

The first pull-down module 250 includes a fifth transistor T5, a sixth transistor T6, a seventh transistor T7, an eighth transistor T8 and a ninth transistor T9. The first pull-down maintaining module 230 includes a tenth transistor T10, an eleventh transistor T11, a twelfth transistor T12, a thirteenth transistor T13 and a fourteenth transistor T14. The second pull-down maintaining module 240 includes a fifteenth transistor T15, a sixteenth transistor T16, a seventeenth transistor T17, an eighteenth transistor T18 and a nineteenth transistor T19. Gates of the fifth transistor T5, the sixth transistor T6, the seventh transistor T7 all are electrically connected to the first common node Q 270. Sources of the sixth transistor T6 and the seventh transistor T7 are electrically connected to a fifth signal input terminal 251. Gates of the eighteenth transistor T8 and the ninth transistor T9 are electrically connected to the first stage-shift signal input terminal 211, and sources of the eighteenth transistor T8 and the ninth transistor T9 are electrically connected to the fifth signal input terminal 251. Sources of the tenth transistor T10, the eleventh transistor T11 and the twelfth transistor T12 and a gate of the twelfth transistor T12 all are electrically connected to a third signal input terminal 232, a gate of the tenth transistor T10 is electrically connected to a third stage-shift signal input terminal 231, a source of the tenth transistor T10 is electrically connected to a source of the eleventh transistor T11 at a second common node P 280. A gate of the eleventh transistor T11 is electrically connected to a source of the twelfth transistor T12, and the source of the twelfth transistor T12 is electrically connected to a drain of the eighth transistor T8. A drain of the thirteenth transistor T13 is electrically connected the first common node Q 270, a gate of the thirteenth transistor T13 is electrically connected to the second common node P 280, and a source of the thirteenth transistor T13 is electrically connected to the fifth signal input terminal 251. A drain of the fourteenth transistor T14 is electrically connected to the scan signal output terminal 223, a gate of the fourteenth transistor T14 is electrically connected to the second common node P 280, and a source of the fourteenth transistor T14 is electrically connected to the fifth signal input terminal 251. Drains of the fifteenth transistor T15, the sixteenth transistor T16 and the seventeenth transistor T17 and a gate of the seventeenth transistor T17 all are electrically connected to a fourth signal input terminal 242, a gate of the fifteenth transistor T15 is electrically connected to a fourth stage-shift signal input terminal 241, and a source of the fifteenth transistor T15 is electrically connected to a source of the sixteenth transistor T16 at a third common node K 290. A gate of the sixteenth transistor T16 is electrically connected to a source of the seventeenth transistor T17, and the source of the seventeenth transistor T17 is electrically connected to a drain of the ninth transistor T9. A drain of the eighteenth transistor T18 is electrically connected to the first common node Q 270, a gate of the eighteenth transistor T18 is electrically connected to the third common node K 290, and a source of the eighteenth transistor t18 is electrically connected to the fifth signal input terminal 251. A drain of the nineteenth transistor T19 is electrically connected to the scan signal output terminal 223, a gate of the nineteenth transistor T19 is electrically connected to the third common node K 290, and a source of the nineteenth transistor T19 is electrically connected to the fifth signal input terminal 251.

The second pull-down module 260 includes a twentieth transistor T20, a twenty-first transistor T21 and a twenty-second transistor T22. Gates of the twentieth transistor T20, the twenty-first transistor T21 and the twenty-second transistor T22 all are electrically connected to a fifth stage-shift signal input terminal 261, sources of the twentieth transistor T20, the twenty-first transistor T21 and the twenty-second transistor T22 are electrically connected to the fifth signal input terminal 251. A drain of the twentieth transistor T20 is electrically connected to the scan signal output terminal 223, a drain of the twenty-first transistor T21 is electrically connected to the first stage-shift signal output terminal 224, and a drain of the twenty-second transistor T22 is electrically connected to the first common node Q 270.

The first stage-shift signal input terminal 211 and the second stage-shift signal input terminal 212 respectively electrically connected to the first stage-shift signal output terminal and the second stage-shift signal output terminal of the preceding-stage shift register to receive signals ST(n−1) and CST(n−1); the third stage-shift signal input terminal 231, the fourth stage-shift signal input terminal 241 and the fifth stage-shift signal input terminal 261 are electrically connected to the first stage-shift signal output terminal of the succeeding-stage shift register to receive an inputted stage-shift signal ST(n+1); the first signal input terminal 221 receives an alternating current clock signal CK(n), the second signal input terminal 222 receives another alternating current clock signal SCK(n), the third signal input terminal 232 and the fourth signal input terminal 242 alternately receive logic-high/low voltage level signals LC1 and LC2, the fifth signal input terminal 251 receives a low voltage level signal Vss, the first stage-shift output terminal 224 and the second stage-shift output terminal 225 are electrically connected to the preceding-stage or the succeeding-stage shift register to supply stage-shift signals ST(n) and CST(n), the scan signal output terminal 223 is for outputting a scan signal G(n).

Figure 3:
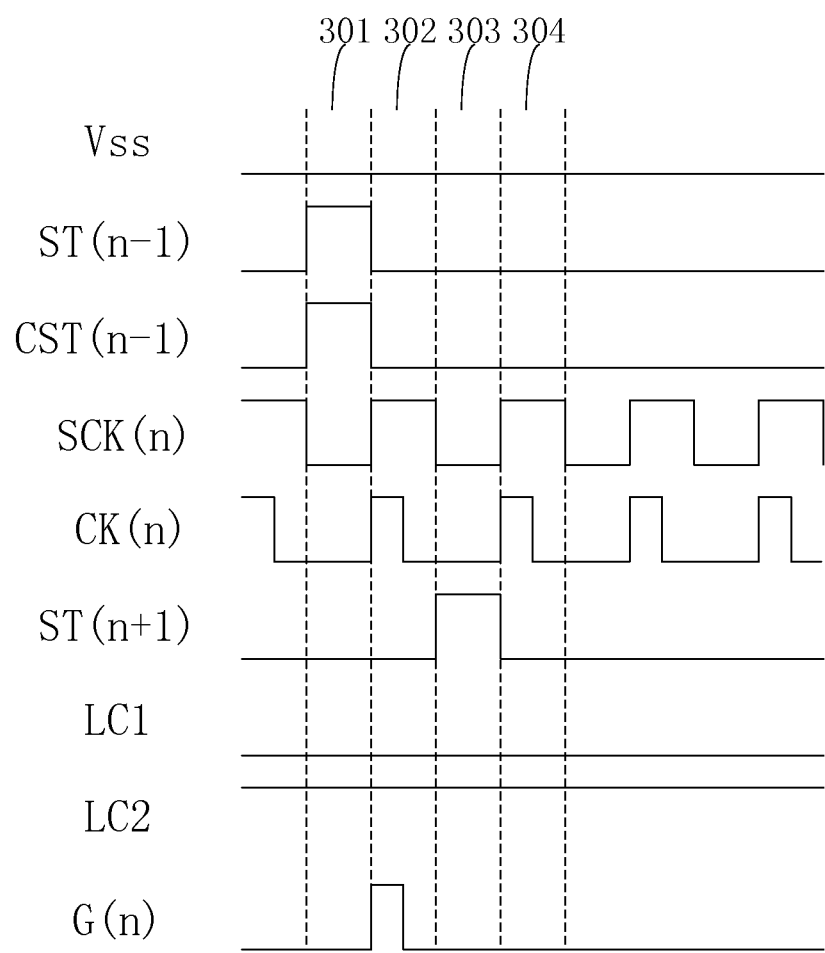
FIG. 3 is a timing diagram of the second embodiment of the shift register of the invention.

Referring to FIG. 3, a timing diagram of the second embodiment of the shift register of the invention is shown. An operation process of the circuit is as follows:

In a time interval 301: ST(n−1) and CST(n−1) both are at high voltage levels, T1 is turned on, the Q node 270 is charged to a high voltage level, T5, T6, T7, T8 and T9 all are turned on, because Vss is at a low voltage level, the potentials at the P node 280 and the K node 290 are pulled down to the low voltage level, T13, T14, T18, T19 all are turned off but T2, T3, T4 are turned on, CK(n) and SCK(n) at this time both are at low voltage levels, and therefore ST(n), CST(n) and G(n) all are outputted as low voltage levels.

In a time interval 302: ST(n−1) and CST(n−1) both are at low voltage levels, T1 is turned off, the Q node 270 still is maintained at the high voltage level, T2, T3, T4 still are turned on, CK(n) and SCK(n) at this time both become high voltage levels, ST(n), CST(n) and G(n) all are outputted as high voltage levels, due to the coupling of the capacitor C, the Q node 770 is lifted to a higher voltage level, T5, T6, T7, T8, T9 at this time all still are turned on, because Vss is at a low voltage level, the potentials at the P node 280 and the K node 290 are pulled down to the low voltage level, T13, T14, T18, T19 still are turned off, ST(n), CST(n) and G(n) are successfully outputted.

In the late of the time interval 302, CK(n) becomes a low voltage level, SCK(n) still is at the high voltage level, ST(n) and CST(n) are successfully outputted as high voltage levels, G(n) is successfully outputted as a low voltage level.

In a time interval 303: CK(n) and SCK(n) both are low voltage levels, ST(n+1) is at a high voltage level, T10, T17, T20, T21, T22 at this time are turned on, the P node 280 is pulled down to a low voltage level while the K node 290 is pulled up to high voltage level (whereas, if LC1 is at a high voltage level and LC2 is at a low voltage level at this time, the K node 290 is pulled down to a low voltage level while the P node 280 is pulled up to a high voltage level), T18, T19 are turned on so that the Q node 270 and the potential level of G(n) are pulled down to Vss, and subsequently, T5, T6, T7, T8, T9 are turned off.

In a time interval 304: LC1 and LC2 alternately are at high voltage levels so as to alternately charge the node P or the node K, T13 and T14 or T18 and T19 alternately are turned on, so that the Q node 270 and the potential of G(n) are maintained at the low voltage level.

Since CK(n) is an alternating current signal, T2 is large and thus has a large parasitic capacitance, a change (from a low voltage level to a high voltage level) of the signal CK(n) would couple a high voltage level onto the Q node 270, so that a leakage of electricity occurs on T2, G(n) would be unable to stably output a low voltage level, and therefore it is necessary that the Q node and the potential level of G(n) always are pulled down after the high voltage level output of G(n).

In addition, this embodiment uses amorphous silicon TFTs to constitute the circuit, because the deterioration problem of TFT is considered, the first pull-down module 230 and the second pull-down module 240 alternately work so as to prevent the gates of T13, T14, T18, T19 from having positive bias voltages applied thereon in most of time of a frame and thereby avoid the deterioration of T13, T14, T18, T19.

Figure 4:
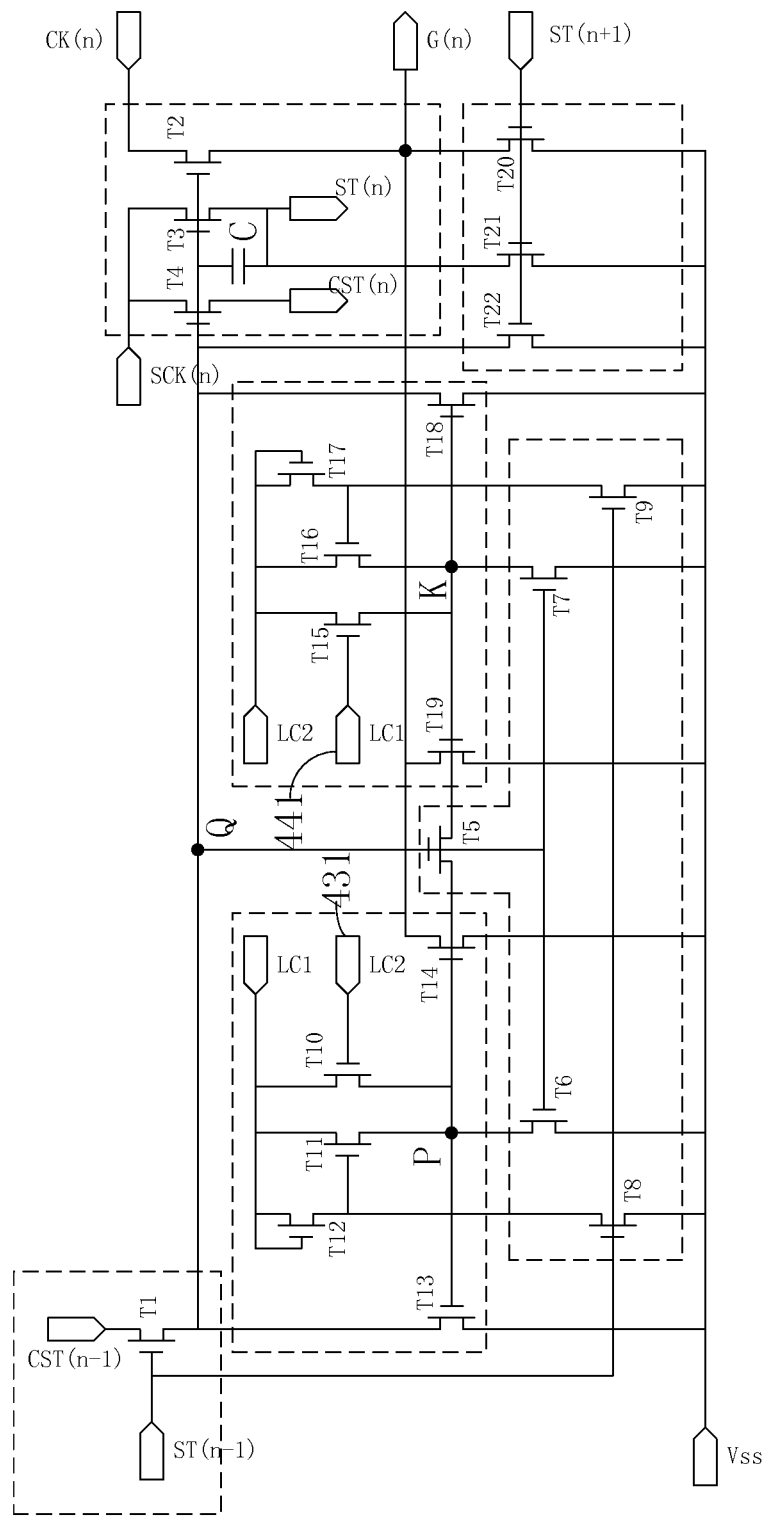
FIG. 4 is a circuit diagram of a third embodiment of the shift register of the invention.

Referring to FIG. 4, a circuit diagram of a third embodiment of the shift register of the invention is shown. A difference of the circuit shown in FIG. 4 from the circuit in the second embodiment of the invention is that: the gate of T10 is electrically connected to a signal input terminal 431 to receive the LC2 signal instead, the gate of T15 is electrically connected to a signal input terminal 441 to receive the LC1 signal instead, and the signals LC2 and LC1 respectively are used to control ON-OFF states of T10 and T15.

Figure 5:
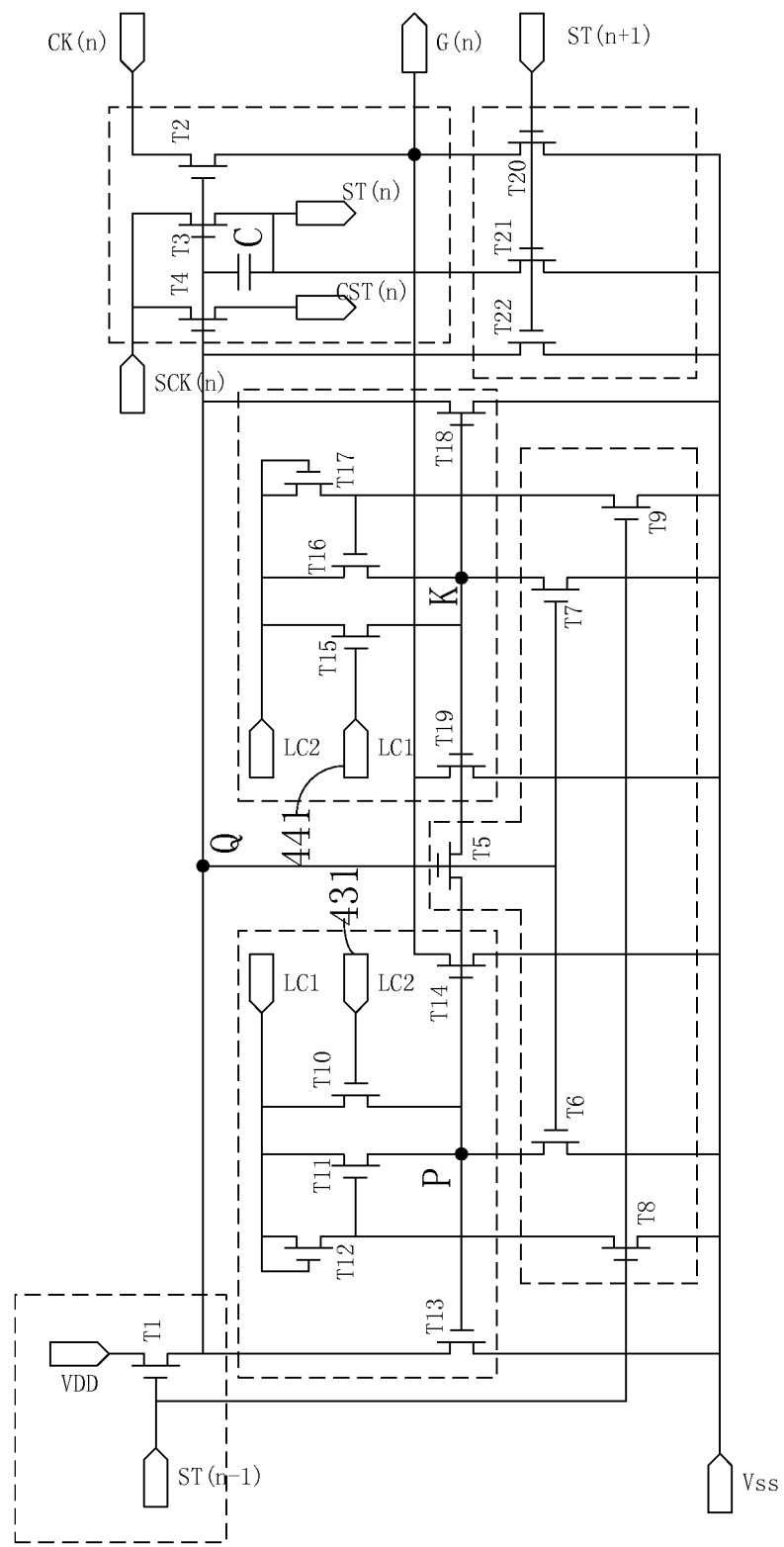
FIG. 5 is a circuit diagram of a fourth embodiment of the shift register of the invention.

Referring to FIG. 5, a circuit diagram of a fourth embodiment of the shift register of the invention is shown. A difference of the circuit as shown in FIG. 5 from the circuit in the third embodiment of the invention is that: the drain of T1 is electrically connected to a direct current (DC) source VDD instead to charge the Q node.

Figure 6:
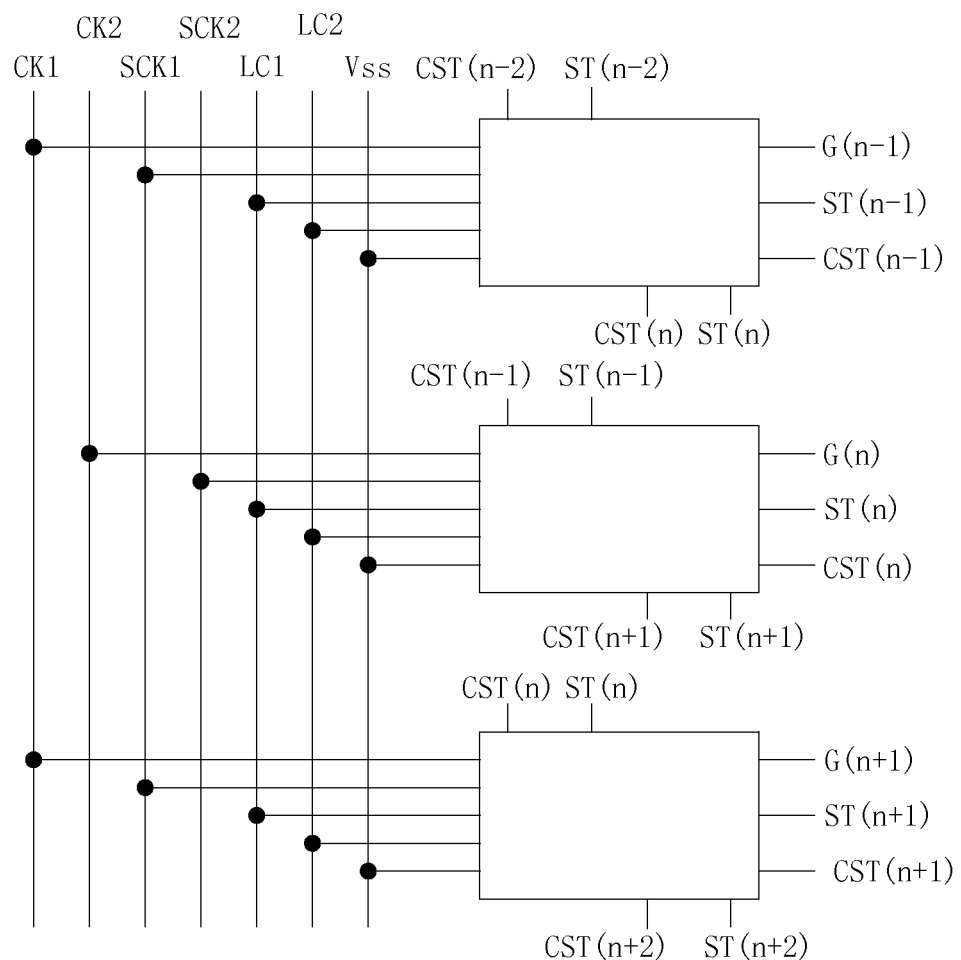
FIG. 6 is a partial schematic diagram of a circuit structure of a first embodiment of a stage-shift gate driving circuit of the invention.

Referring to FIG. 6, a schematic partial diagram of a circuit structure of a first embodiment of a stage-shift gate driving circuit of the invention is shown. The gate driving circuit includes a plurality of above-described shift registers. The first stage-shift signal output terminal and the second stage-shift signal output terminal of each shift register are electrically connected to corresponding stage-shift signal input terminals of the preceding-stage shift register and the succeeding-stage shift register and for supplying stage-shift signals thereto.

Moreover, the first stage-shift signal input terminal and the second stage-shift signal input terminal of the first-stage shift register in the stage-shift gate driving circuit is electrically connected to receive a STV signal (generally referred to as start pulse signal), the third stage-shift signal input terminal, the fourth stage-shift signal input terminal and the fifth stage-shift signal input terminal of the final-stage shift register in the stage-shift gate driving circuit are electrically connected to receive the STV signal.

The invention further provides a display panel, and the display panel includes the above-described stage-shift gate driving circuit.

By configuring the display panel with the above-described stage-shift gate driving circuit, the occupied space of circuit can be reduced and the border of the display panel can be narrowed. Furthermore, by configuring the two pull-down maintaining modules to alternately pull down the potential level at the scan signal output terminal, the deterioration of TFT transistors can be reduced, the output quality can be ensured and the cost can be reduced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A shift register comprising: a down-delivering module, an output module, a first pull-down maintaining module, a second pull-down maintaining module, a first pull-down module and a second pull-down module; wherein the down-delivering module, the output module, the first pull-down maintaining module and the second pull-down maintaining module are electrically connected to a first common node; the first pull-down module and the first pull-down maintaining module are electrically connected to a second common node; the first pull-down module and the second pull-down maintaining module are electrically connected to a third common node; the second pull-down module and the first pull-down module are connected to a common low voltage level signal terminal; the second pull-down module and the output module both are electrically connected to a scan signal output terminal;

a potential of the first common node becomes a high voltage level when the down-delivering module receives a high voltage level stage-shift signal(s) from a preceding-stage shift register, the first pull-down maintaining module and the second pull-down maintaining module are configured for alternately receiving a high voltage level signal inputted from a succeeding-stage shift register and thereby making the first pull-down module to be electrically conducted with the first common node so as to pull down and maintain the first common node to be a low voltage level, and meanwhile the second pull-down module is configured for pulling down and maintaining a scan signal outputted from the output module to be a low voltage level according to the state of the first pull-down module being electrically conducted with the first common node.

2. The shift register as claimed in claim 1, wherein the down-delivering module comprises a first stage-shift signal input terminal and a second stage-shift signal input terminal respectively electrically connected to a first stage-shift signal output terminal and a second stage-shift signal output terminal of the preceding-stage shift register;

the output module comprises a first signal input terminal, a second signal input terminal, a first stage-shift signal output terminal, a second stage-shift signal output terminal and the scan signal output terminal;

the first stage-shift signal output terminal and the second stage-shift signal output terminal of the output module are configured for being respectively electrically connected to a first stage-shift signal input terminal and a second stage-shift signal input terminal of the preceding-stage and/or the succeeding-stage shift register and for supplying stage-shift signals, the first signal input terminal and the second signal input terminal are configured for receiving alternating current signals;

the first pull-down maintaining module comprises a third stage-shift signal input terminal and a third signal input terminal, the third stage-shift signal input terminal is configured for being electrically connected to a first stage-shift signal output terminal of the succeeding-stage shift register, and the third signal input terminal is configured for receiving an alternating current signal;

the second pull-down maintaining module comprises a fourth stage-shift signal input terminal and a fourth signal input terminal, the fourth stage-shift signal input terminal is configured for being electrically connected to the first stage-shift signal output terminal of the succeeding-stage shift register, and the fourth signal input terminal is configured for receiving an alternating current signal;

the first pull-down module comprises a fifth signal input terminal configured for receiving a low voltage level signal and as being the common low voltage level signal terminal;

the second pull-down module comprises a fifth stage-shift signal input terminal configured for being electrically connected to the first stage-shift signal output terminal of the succeeding-stage shift register;

when the down-delivering module receives the high voltage level stage-shift signals from the preceding-stage shift register by the first stage-shift signal input terminal and the second stage-shift signal input terminal, the potential at the first common node becomes the high voltage level, the first signal input terminal and the second signal input terminal of the output module receive low voltage level clock signals, and the output module outputs a low voltage level scan signal by the scan signal output terminal;

after the down-delivering module is turned off, the first common node still is at the high voltage level, the first signal input terminal and the second signal input terminal of the output module receive high voltage level clock signals, and the output module outputs a high voltage level scan signal by the scan signal output terminal;

after the scan signal output terminal outputs the high voltage level scan signal, the third stage-shift signal input terminal, the fourth stage-shift signal input terminal and the sixth signal input terminal are inputted with a high voltage level stage-shift signal from the first stage-shift signal output terminal of the succeeding-stage shift register, the third signal input terminal and the fourth signal input terminal are alternately inputted with high voltage level signals to make the first pull-down module be electrically conducted with the first common node and thereby alternately to pull down the first common node and the scan signal output terminal to a low voltage level, and meanwhile the second pull-down module pulls down the first common node and the scan signal output terminal to the low voltage level.

3. The shift register as claimed in claim 2, wherein the down-delivering module comprises a first transistor;

a drain of the first transistor is electrically connected to the second stage-shift signal input terminal or a direct current source, a source of the first transistor is electrically connected to the first common node, and a gate of the first transistor is electrically connected to the first stage-shift signal input terminal.

4. The shift register as claimed in claim 2, wherein the output module comprises a second transistor, a third transistor and a fourth transistor;
   a drain of the second transistor is electrically connected to the first signal input terminal, and a source of the second transistor is electrically connected to the scan signal output terminal;
   a drain of the third transistor is electrically connected to the second signal input terminal, and a source of the third transistor is electrically connected to the first stage-shift signal output terminal;
   a drain of the fourth transistor is electrically connected to the second signal input terminal, and a source of the fourth transistor is electrically connected to the second stage-shift signal output terminal;
   gates of the second transistor, the third transistor and the fourth transistor all are electrically connected to the first common node;
   a gate of the third transistor and the source of the third transistor have a capacitor electrically connected therebetween.

5. The shift register as claimed in claim 2, wherein the first pull-down module comprises a fifth transistor, a sixth transistor, a seventh transistor, an eighth transistor and a ninth transistor; the first pull-down maintaining module comprises a tenth transistor, an eleventh transistor, a twelfth transistor, a thirteenth transistor and a fourteenth transistor; the second pull-down maintaining module comprises a fifteenth transistor, a sixteenth transistor, a seventeenth transistor, an eighteenth transistor and a nineteenth transistor;
   gates of the fifth transistor, the sixth transistor and the seventh transistor all are electrically connected to the first common node, sources of the sixth transistor and the seventh transistor are electrically connected to the fifth signal input terminal;
   gates of the eighth transistor and the ninth transistor are electrically connected to the first stage-shift signal input terminal, sources of the eighth transistor and the ninth transistor are electrically connected to the fifth signal input terminal;
   drains of the tenth transistor, the eleventh transistor and the twelfth transistor and a gate of the twelfth transistor all are electrically connected to the third signal input terminal, a gate of the tenth transistor is electrically connected to the third stage-shift signal input terminal, and a source of the tenth transistor is electrically connected to a source of the eleventh transistor at the second common node;
   a gate of the eleventh transistor is electrically connected to a source of the twelfth transistor;
   the source of the twelfth transistor is electrically connected to a drain of the eighth transistor;
   a drain of the thirteenth transistor is electrically connected to the first common node, a gate of the thirteenth transistor is electrically connected to the second common node, and a source of the thirteenth transistor is electrically connected to the fifth signal input terminal;
   a drain of the fourteenth transistor is electrically connected to the scan signal output terminal, a gate of the fourteenth transistor is electrically connected to the second common node, and a source of the fourteenth transistor is electrically connected to the fifth signal input terminal;
   drains of the fifteenth transistor, the sixteenth transistor and the seventeenth transistor and a gate of the seventeenth transistor all are electrically connected to the fourth signal input terminal, a gate of the fifteenth transistor is electrically connected to the fourth stage-shift signal input terminal, and a source of the fifteenth transistor is electrically connected to a source of the sixteenth transistor at the third common node;
   a gate of the sixteenth transistor is electrically connected to a source of the seventeenth transistor;
   the source of the seventeenth transistor is electrically connected to a drain of the ninth transistor;
   a drain of the eighteenth transistor is electrically connected to the first common node, a gate of the eighteenth transistor is electrically connected to the third common node, and a source of the eighteenth transistor is electrically connected to the fifth signal input terminal;
   a drain of the nineteenth transistor is electrically connected to the scan signal output terminal, a gate of the nineteenth transistor is electrically connected to the third common node, and a source of the nineteenth transistor is electrically connected to the fifth signal input terminal.

6. The shift register as claimed in claim 5, wherein the gate of the tenth transistor is changed to be electrically connected with the fourth signal input terminal, and the gate of the fifteenth transistor is changed to be electrically connected with the third signal input terminal.

7. The shift register as claimed in claim 2, wherein the second pull-down module comprises a twentieth transistor, a twenty-first transistor and a twenty-second transistor;
   gates of the twentieth transistor, the twenty-first transistor and the twenty-second transistor all are electrically connected to the fifth stage-shift signal input terminal, sources of the twentieth transistor, the twenty-first transistor and the twenty-second transistor all are electrically connected to the fifth signal input terminal;
   a drain of the twentieth transistor is electrically connected to the scan signal output terminal, a drain of the twenty-first transistor is electrically connected to the first stage-shift signal output terminal, and a drain of the twenty-second transistor is electrically connected to the first common node.

8. A stage-shift gate driving circuit comprising a plurality of shift registers as claimed in claim 1;
   wherein the first stage-shift signal output terminal and the second stage-shift signal output terminal of each of the plurality of shift registers are electrically connected to corresponding stage-shift signal input terminals of a preceding-stage shift register and a succeeding-stage shift register and for supplying stage-shift signals.

9. The stage-shift gate driving circuit as claimed in claim 8, wherein the first stage-shift signal input terminal and the second stage-shift signal input terminal of the first-stage shift of the stage-shift gate driving circuit are electrically connected to receive a STV signal;
   the third stage-shift signal input terminal, the fourth stage-shift signal input terminal and the fifth stage-shift signal input terminal of the final-stage shift register are electrically connected to receive the STV signal.

10. The stage-shift gate driving circuit as claimed in claim 8, wherein
    the down-delivering module comprises a first stage-shift signal input terminal and a second stage-shift signal input terminal respectively electrically connected to a first stage-shift signal output terminal and a second stage-shift signal output terminal of the preceding-stage shift register;

the output module comprises a first signal input terminal, a second signal input terminal, a first stage-shift signal output terminal, a second stage-shift signal output terminal and the scan signal output terminal;

the first stage-shift signal output terminal and the second stage-shift signal output terminal of the output module are configured for being respectively electrically connected to a first stage-shift signal input terminal and a second stage-shift signal input terminal of the preceding-stage and/or the succeeding-stage shift register and for supplying stage-shift signals, the first signal input terminal and the second signal input terminal are configured for receiving alternating current signals;

the first pull-down maintaining module comprises a third stage-shift signal input terminal and a third signal input terminal, the third stage-shift signal input terminal is configured for being electrically connected to a first stage-shift signal output terminal of the succeeding-stage shift register, and the third signal input terminal is configured for receiving an alternating current signal;

the second pull-down maintaining module comprises a fourth stage-shift signal input terminal and a fourth signal input terminal, the fourth stage-shift signal input terminal is configured for being electrically connected to the first stage-shift signal output terminal of the succeeding-stage shift register, and the fourth signal input terminal is configured for receiving an alternating current signal;

the first pull-down module comprises a fifth signal input terminal configured for receiving a low voltage level signal and as being the common low voltage level signal terminal;

the second pull-down module comprises a fifth stage-shift signal input terminal configured for being electrically connected to the first stage-shift signal output terminal of the succeeding-stage shift register;

when the down-delivering module receives the high voltage level stage-shift signals from the preceding-stage shift register by the first stage-shift signal input terminal and the second stage-shift signal input terminal, the potential at the first common node becomes the high voltage level, the first signal input terminal and the second signal input terminal of the output module receive low voltage level clock signals, and the output module outputs a low voltage level scan signal by the scan signal output terminal;

after the down-delivering module is turned off, the first common node still is at the high voltage level, the first signal input terminal and the second signal input terminal of the output module receive high voltage level clock signals, and the output module outputs a high voltage level scan signal by the scan signal output terminal;

after the scan signal output terminal outputs the high voltage level scan signal, the third stage-shift signal input terminal, the fourth stage-shift signal input terminal and the sixth signal input terminal are inputted with a high voltage level stage-shift signal from the first stage-shift signal output terminal of the succeeding-stage shift register, the third signal input terminal and the fourth signal input terminal are alternately inputted with high voltage level signals to make the first pull-down module be electrically conducted with the first common node and thereby alternately to pull down the first common node and the scan signal output terminal to a low voltage level, and meanwhile the second pull-down module pulls down the first common node and the scan signal output terminal to the low voltage level.

11. The stage-shift gate driving circuit as claimed in claim 10, wherein the down-delivering module comprises a first transistor;
a drain of the first transistor is electrically connected to the second stage-shift signal input terminal or a direct current source, a source of the first transistor is electrically connected to the first common node, and a gate of the first transistor is electrically connected to the first stage-shift signal input terminal.

12. The stage-shift gate driving circuit as claimed in claim 10, wherein the output module comprises a second transistor, a third transistor and a fourth transistor;
a drain of the second transistor is electrically connected to the first signal input terminal, and a source of the second transistor is electrically connected to the scan signal output terminal;
a drain of the third transistor is electrically connected to the second signal input terminal, and a source of the third transistor is electrically connected to the first stage-shift signal output terminal;
a drain of the fourth transistor is electrically connected to the second signal input terminal, and a source of the fourth transistor is electrically connected to the second stage-shift signal output terminal;
gates of the second transistor, the third transistor and the fourth transistor all are electrically connected to the first common node;
a gate of the third transistor and the source of the third transistor have a capacitor electrically connected therebetween.

13. The stage-shift gate driving circuit as claimed in claim 10, wherein the first pull-down module comprises a fifth transistor, a sixth transistor, a seventh transistor, an eighth transistor and a ninth transistor; the first pull-down maintaining module comprises a tenth transistor, an eleventh transistor, a twelfth transistor, a thirteenth transistor and a fourteenth transistor; the second pull-down maintaining module comprises a fifteenth transistor, a sixteenth transistor, a seventeenth transistor, an eighteenth transistor and a nineteenth transistor;
gates of the fifth transistor, the sixth transistor and the seventh transistor all are electrically connected to the first common node, sources of the sixth transistor and the seventh transistor are electrically connected to the fifth signal input terminal;
gates of the eighth transistor and the ninth transistor are electrically connected to the first stage-shift signal input terminal, sources of the eighth transistor and the ninth transistor are electrically connected to the fifth signal input terminal;
drains of the tenth transistor, the eleventh transistor and the twelfth transistor and a gate of the twelfth transistor all are electrically connected to the third signal input terminal, a gate of the tenth transistor is electrically connected to the third stage-shift signal input terminal, and a source of the tenth transistor is electrically connected to a source of the eleventh transistor at the second common node;
a gate of the eleventh transistor is electrically connected to a source of the twelfth transistor;
the source of the twelfth transistor is electrically connected to a drain of the eighth transistor;

a drain of the thirteenth transistor is electrically connected to the first common node, a gate of the thirteenth transistor is electrically connected to the second common node, and a source of the thirteenth transistor is electrically connected to the fifth signal input terminal;

a drain of the fourteenth transistor is electrically connected to the scan signal output terminal, a gate of the fourteenth transistor is electrically connected to the second common node, and a source of the fourteenth transistor is electrically connected to the fifth signal input terminal;

drains of the fifteenth transistor, the sixteenth transistor and the seventeenth transistor and a gate of the seventeenth transistor all are electrically connected to the fourth signal input terminal, a gate of the fifteenth transistor is electrically connected to the fourth stage-shift signal input terminal, and a source of the fifteenth transistor is electrically connected to a source of the sixteenth transistor at the third common node;

a gate of the sixteenth transistor is electrically connected to a source of the seventeenth transistor;

the source of the seventeenth transistor is electrically connected to a drain of the ninth transistor;

a drain of the eighteenth transistor is electrically connected to the first common node, a gate of the eighteenth transistor is electrically connected to the third common node, and a source of the eighteenth transistor is electrically connected to the fifth signal input terminal;

a drain of the nineteenth transistor is electrically connected to the scan signal output terminal, a gate of the nineteenth transistor is electrically connected to the third common node, and a source of the nineteenth transistor is electrically connected to the fifth signal input terminal.

14. The stage-shift gate driving circuit as claimed in claim 13, wherein the gate of the tenth transistor is changed to be electrically connected with the fourth signal input terminal, and the gate of the fifteenth transistor is changed to be electrically connected with the third signal input terminal.

15. The stage-shift gate driving circuit as claimed in claim 10, wherein the second pull-down module comprises a twentieth transistor, a twenty-first transistor and a twenty-second transistor;

gates of the twentieth transistor, the twenty-first transistor and the twenty-second transistor all are electrically connected to the fifth stage-shift signal input terminal, sources of the twentieth transistor, the twenty-first transistor and the twenty-second transistor all are electrically connected to the fifth signal input terminal;

a drain of the twentieth transistor is electrically connected to the scan signal output terminal, a drain of the twenty-first transistor is electrically connected to the first stage-shift signal output terminal, and a drain of the twenty-second transistor is electrically connected to the first common node.

16. A display panel comprising a stage-shift gate driving circuit as claimed in claim 8.

17. The display panel as claimed in claim 16, wherein the first stage-shift signal input terminal and the second stage-shift signal input terminal of the first-stage shift register of the stage-shift gate driving signal are electrically connected to receive a STV signal;

the third stage-shift signal input terminal, the fourth stage-shift signal input terminal and the fifth stage-shift signal input terminal of the final-stage shift register of the stage-shift gate driving circuit are electrically connected to receive the STV signal.

\* \* \* \* \*